US012647092B2

(12) United States Patent
Hung et al.

(10) Patent No.: US 12,647,092 B2
(45) Date of Patent: Jun. 2, 2026

(54) METHOD FOR CREATING USAGE SCENARIO DETERMINATION DATABASE AND MOBILE COMMUNICATION SYSTEM FOR THE SAME

(71) Applicant: MEDIATEK Inc., Hsinchu City (TW)

(72) Inventors: Chung-Yu Hung, Hsinchu City (TW); Chun-Yen Wu, Hsinchu City (TW); Jen-Chung Chiang, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 331 days.

(21) Appl. No.: 18/413,306

(22) Filed: Jan. 16, 2024

(65) Prior Publication Data

US 2025/0233574 A1      Jul. 17, 2025

(51) Int. Cl.
H03H 7/40        (2006.01)
H04B 1/04        (2006.01)
(52) U.S. Cl.
CPC ............. H03H 7/40 (2013.01); H04B 1/0458 (2013.01)
(58) Field of Classification Search
CPC ...... H03H 7/40; H04B 1/0458; H04B 17/101; H04B 17/102; H04B 17/201; H04B 1/40; G01R 27/26; H01Q 1/243
See application file for complete search history.

(56) References Cited

U.S. PATENT DOCUMENTS

| | | | | |
|---|---|---|---|---|
| 10,312,582 B2 * | 6/2019 | Shi | ............................ | H01Q 1/50 |
| 2017/0264322 A1 * | 9/2017 | Greene | .................... | H04B 1/40 |
| 2018/0367177 A1 * | 12/2018 | Ramasamy | ............ | H04B 1/126 |
| 2021/0136601 A1 * | 5/2021 | Winslow | ................ | G06N 20/00 |
| 2023/0006629 A1 * | 1/2023 | Lenhart | .................. | G06N 20/00 |
| 2023/0099297 A1 * | 3/2023 | Calzolari | ................. | H04B 1/40 |
| | | | | 455/702 |
| 2023/0110141 A1 * | 4/2023 | Ramasamy | ............ | H01Q 1/245 |
| | | | | 370/252 |
| 2024/0097801 A1 * | 3/2024 | Spits | ...................... | H04B 17/14 |
| 2025/0062783 A1 * | 2/2025 | Li | ........................... | H04B 17/12 |

* cited by examiner

*Primary Examiner* — Cindy Trandai
(74) *Attorney, Agent, or Firm* — McClure, Qualey & Rodack, LLP

(57)        ABSTRACT

The application provides a method for creating a usage scenario determination database and a mobile communication system for the same. In creating a first part of the usage scenario determination database, an impedance of at least one first tuner is repeatedly measured until all antennas among the antenna group are selected, a plurality of predetermined testing frequencies are selected and a plurality of tuning states of the at least one first tuner are selected. In creating a second part of the usage scenario determination database, an antenna impedance is repeatedly measured until all antennas among the antenna group are selected, the plurality of predetermined testing frequencies are selected, a plurality of tuning states of at least one second tuner are selected and at least one usage scenario is selected. The usage scenario determination database is created base on the first part and the second part.

20 Claims, 7 Drawing Sheets

Start

610
In creating a first part of the usage scenario determination database, repeatedly measuring an impedance of at least one first tuner until all antennas among the antenna group are selected, a plurality of predetermined testing frequencies are selected and a plurality of tuning states of the at least one first tuner are selected, wherein the at least one first tuner is an impedance tuner for impedance matching 620
In creating a second part of the usage scenario determination database, repeatedly measuring an antenna impedance until all antennas among the antenna group are selected, the plurality of predetermined testing frequencies are selected, a plurality of tuning states of at least one second tuner are selected and at least one usage scenario is selected, wherein the at least one second tuner is an aperture tuner for aperture tuning 630
Creating the usage scenario determination database base on the first part and the second part of the usage scenario determination database End

100

100

————— FS      — — — HL      —— — HR

CW1_2     CW1_3

CW1_1     CW1_4

150

A2     W

X     X

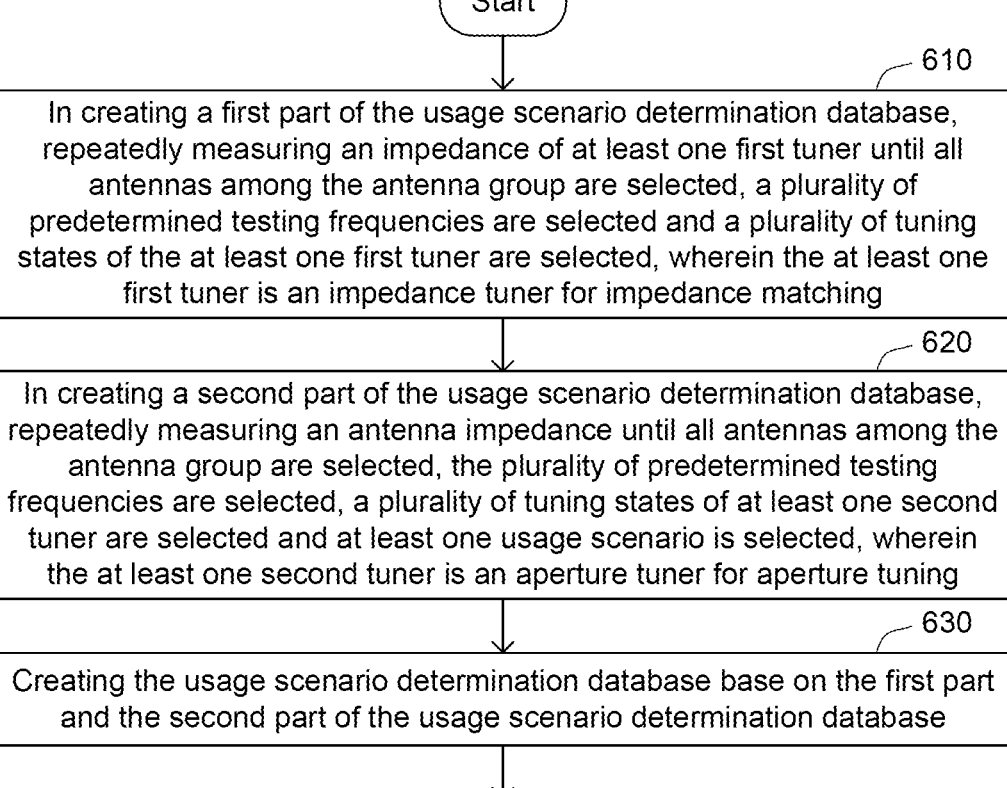

Start

610

In creating a first part of the usage scenario determination database, repeatedly measuring an impedance of at least one first tuner until all antennas among the antenna group are selected, a plurality of predetermined testing frequencies are selected and a plurality of tuning states of the at least one first tuner are selected, wherein the at least one first tuner is an impedance tuner for impedance matching

620

In creating a second part of the usage scenario determination database, repeatedly measuring an antenna impedance until all antennas among the antenna group are selected, the plurality of predetermined testing frequencies are selected, a plurality of tuning states of at least one second tuner are selected and at least one usage scenario is selected, wherein the at least one second tuner is an aperture tuner for aperture tuning

630

Creating the usage scenario determination database base on the first part and the second part of the usage scenario determination database End

FIG. 6

METHOD FOR CREATING USAGE SCENARIO DETERMINATION DATABASE AND MOBILE COMMUNICATION SYSTEM FOR THE SAME

TECHNICAL FIELD

The disclosure relates in general to a method for creating a usage scenario determination database and a mobile communication system for the same.

BACKGROUND

With the advancements in mobile communication technology, mobile communication systems such as mobile phones, tablet computers, notebook computers, and other hybrid functional portable communication electronic devices have become more common. To satisfy user requirements, mobile communication systems can usually perform wireless communication functions. Some devices cover a large wireless communication area; and these include mobile phones using 2G, 3G, and LTE (Long Term Evolution) systems and using frequency bands of 700 MHz, 850 MHz, 900 MHz, 1800 MHz, 1900 MHz, 2100 MHz, 2300 MHz, and 2500 MHz. Some devices cover a small wireless communication area; and these include mobile phones using Wi-Fi and Bluetooth systems and using frequency bands of 2.4 GHz, 5.2 GHz, and 5.8 GHz.

An antenna is an indispensable component in a mobile device that supports wireless communication. However, antennas can easily be affected by an adjacent human body, which often interferes with the antenna and degrades the overall communication quality. Furthermore, the SAR (Specific Absorption Rate) may be too high to comply with regulations and laws. Accordingly, there is a need to propose a novel solution for solving the problems.

Still further, in some application, there is a need to determine a usage scenario of the mobile communication systems. If the usage scenario determination is not accuracy, then the user experience may be negatively affected. However, in order to having a correct usage scenario determination, a usage scenario determination database has to be created. If the usage scenario determination database has a large memory size, the memory usage efficiency is not good.

Thus, there needs a method for creating a usage scenario determination database and a mobile communication system for the same, which can determine usage scenario more accurately even when the scenario determination database has a small memory size and thus good memory usage efficiency.

SUMMARY

According to one embodiment, a method for creating a usage scenario determination database is provided. The method comprises: in creating a first part of the usage scenario determination database, repeatedly measuring an impedance of at least one first tuner until all antennas among the antenna group are selected, a plurality of predetermined testing frequencies are selected and a plurality of tuning states of at least one first tuner are selected, wherein the at least one first tuner is an impedance tuner for impedance matching; in creating a second part of the usage scenario determination database, repeatedly measuring an antenna impedance until all antennas among the antenna group are selected, the plurality of predetermined testing frequencies are selected, a plurality of tuning states of at least one second tuner are selected and at least one usage scenario is selected, wherein the at least one second tuner is an aperture tuner for aperture tuning; and creating the usage scenario determination database base on the first part and the second part of the usage scenario determination database.

In some embodiments, in creating the first part of the usage scenario determination database, when a first antenna among the antenna group is selected, a first testing frequency among the plurality of predetermined testing frequencies is selected and a first tuning state of the plurality of tuning states of the at least one first tuner is selected, the impedance of the at least one first tuner is measured to generate a first data of the first part of the usage scenario determination database. In some embodiments, the first part of the usage scenario determination database includes "n*m*a" impedance data, wherein the "n" is a positive integer and represents a number of antennas in the antenna group, the "m" is a positive integer and represents a number of the predetermined testing frequencies, and the "a" is a positive integer and represents a number of the tuner states of the at least one first tuner. In some embodiments, in creating the second part of the usage scenario determination database, when a first antenna among the antenna group is selected, a first testing frequency among the plurality of predetermined testing frequencies is selected, a first tuning state of the plurality of tuning states of the at least one second tuner is selected and a first usage scenario of the at least one usage scenario is selected, the antenna impedance is measured to generate a first data of the second part of the usage scenario determination database. In some embodiments, the second part of the usage scenario determination database includes "n*m*b*z" impedance data, wherein the "n" is a positive integer and represents a number of antennas in the antenna group, the "m" is a positive integer and represents a number of the predetermined testing frequencies, the "b" is a positive integer and represents a number of the tuner states of the at least one second tuner, and the "z" is a positive integer and represents a number of the at least one usage scenario. In some embodiments, the at least one first tuner is configured to keep an electrical length of an antenna group unchanged as the at least one usage scenario changes. In some embodiments, the at least one second tuner is configured to change the electrical length of the antenna group as the usage scenario changes. In some embodiments, the step of creating the usage scenario determination database base on the first part and the second part of the usage scenario determination database comprising: creating the usage scenario determination database by adding the first part and the second part of the usage scenario determination database together. In some embodiments, the antenna impedance includes a sum of an impedance of the second tuner and an impedance of a corresponding antenna.

According to another embodiment, a mobile communication system is provided. The mobile communication system comprises: an antenna group; a coupler coupled to the antenna group, the coupler being used in impedance measurement of the antenna group; a controller coupled to the coupler; at least one first tuner coupled to the antenna group and the coupler; at least one second tuner coupled to the antenna group and the coupler; and a storage element coupled to the controller, the storage element including a plurality of hardware circuit to store a usage scenario determination database. The controller is configured for: in creating a first part of the usage scenario determination database, repeatedly measuring an impedance of at least one first tuner until all antennas among the antenna group are selected, a plurality of predetermined testing frequencies are selected and a plurality of tuning states of the at least one first tuner are selected, wherein the at least one first tuner is an impedance tuner for impedance matching; in creating a second part of the usage scenario determination database, repeatedly measuring an antenna impedance until all antennas among the antenna group are selected, the plurality of predetermined testing frequencies are selected, a plurality of tuning states of at least one second tuner are selected and at least one usage scenario is selected, wherein the at least one second tuner is an aperture tuner for aperture tuning; and creating the usage scenario determination database base on the first part and the second part of the usage scenario determination database.

In some embodiments, in creating the first part of the usage scenario determination database, when a first antenna among the antenna group is selected, a first testing frequency among the plurality of predetermined testing frequencies is selected and a first tuning state of the plurality of tuning states of the at least one first tuner is selected, the impedance of the at least one first tuner is measured to generate a first data of the first part of the usage scenario determination database. In some embodiments, the first part of the usage scenario determination database includes "n*m*a" impedance data, wherein the "n" is a positive integer and represents a number of antennas in the antenna group, the "m" is a positive integer and represents a number of the predetermined testing frequencies, and the "a" is a positive integer and represents a number of the tuner states of the at least one first tuner. In some embodiments, in creating the second part of the usage scenario determination database, when a first antenna among the antenna group is selected, a first testing frequency among the plurality of predetermined testing frequencies is selected, a first tuning state of the plurality of tuning states of the at least one second tuner is selected and a first usage scenario of the at least one usage scenario is selected, the antenna impedance is measured to generate a first data of the second part of the usage scenario determination database. In some embodiments, the second part of the usage scenario determination database includes "n*m*b*z" impedance data, wherein the "n" is a positive integer and represents a number of antennas in the antenna group, the "m" is a positive integer and represents a number of the predetermined testing frequencies, the "b" is a positive integer and represents a number of the tuner states of the at least one second tuner, and the "z" is a positive integer and represents a number of the at least one usage scenario. In some embodiments, the at least one first tuner keeps an electrical length of an antenna group unchanged as the usage scenario changes, and the at least one second tuner changes the electrical length of the antenna group as the usage scenario changes. In some embodiments, the antenna impedance includes a sum of an impedance of the second tuner and an impedance of a corresponding antenna.

According to another embodiment, a method for creating a usage scenario determination database is provided. The method comprises: creating a first part of the usage scenario determination database by repeatedly measuring an impedance of at least one first tuner until all antennas among the antenna group are selected, a plurality of predetermined testing frequencies are selected and a plurality of tuning states of at least one first tuner are selected, wherein the first part includes "n*m*a" impedance data, wherein the "n" is a positive integer and represents a number of the antennas in the antenna group, the "m" is a positive integer and represents a number of the predetermined testing frequencies, and the "a" is a positive integer and represents a number of the tuner states of the at least one first tuner, wherein the at least one first tuner is a usage scenario-independent tuner; creating a second part of the usage scenario determination database by repeatedly measuring an antenna impedance until all antennas among the antenna group are selected, the plurality of predetermined testing frequencies are selected, a plurality of tuning states of at least one second tuner are selected and at least one usage scenario is selected, the second part of the usage scenario determination database includes "n*m*b*z" impedance data, wherein the "b" is a positive integer and represents a number of the tuner states of the at least one second tuner, and the "z" is a positive integer and represents a number of the at least one usage scenario, wherein the at least one second tuner is a usage scenario-dependent tuner; and creating the usage scenario determination database base on the first part and the second part of the usage scenario determination database.

In some embodiments, the at least one first tuner is an impedance tuner used for impedance matching, and the at least one second tuner is an aperture tuner used for aperture tunning. In some embodiments, the at least one first tuner is configured to keep an electrical length of an antenna group unchanged as the usage scenario changes, and the at least one second tuner is configured to change the electrical length of the antenna group as the usage scenario changes. In some embodiments, the usage scenario determination database includes "n*m*a+n*m*b*z" impedance data.

BRIEF DESCRIPTION OF THE DRAWINGS

FIG. 6 shows a method for creating a usage scenario determination database according to one embodiment of the application.

Figure 1:
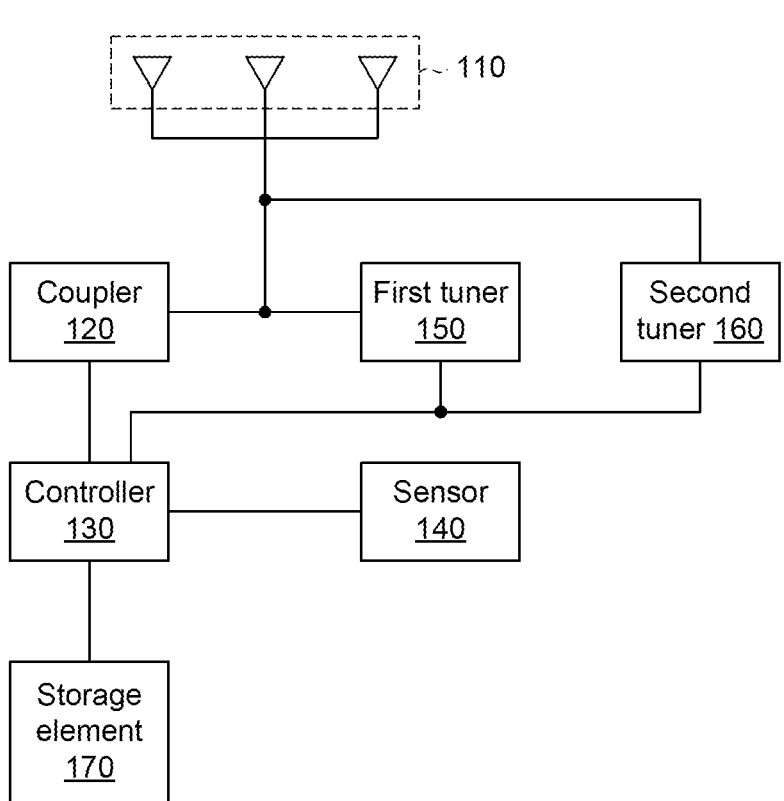
FIG. 1 is a diagram of a mobile communication system according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 is a diagram of a mobile communication system 100 according to one embodiment of the invention. The mobile communication system 100 may be applied to a mobile device, such as a smart phone, a tablet computer, or a notebook computer, but it is not limited thereto. As shown in FIG. 1, the mobile communication system 100 includes an antenna group 110, a coupler 120, a controller 130, a sensor 140, at least one first tuner 150, at least one second tuner 160 and a storage element 170 (for example but not limited by, SSD (solid-state drive)). It should be understood that the mobile communication system 100 may include other components, such as a processor, a power supply module, a touch control panel, and/or a housing, although they are not displayed in FIG. 1. In some embodiments, the following description uses one first tuner 150 and one second tuner 160 as an example, however, it should be understood that there can be multiple first tuners and/or multiple second tuners.

The antenna group 110 includes at least one antenna. The type and style of the antenna group 110 are not limited in the invention. For example, the antenna of the antenna group 110 may be an RF module, a monopole antenna, a dipole antenna, a loop antenna, a hybrid antenna, or a PIFA (Planar Inverted F Antenna). Each of the antennas of the antenna group 110 is assigned with an antenna index.

The coupler 120 is coupled to the antenna group 110. Specifically, the coupler 120 may have a first port coupled to the RF module (not shown), a second port coupled to the antenna group 110, and a coupling port coupled to the controller 130. The coupler 120 may be used in impedance measurement of the transmission antennas of the antenna group 110. Based on the impedance measurement results of the transmission antennas of the antenna group 110, the controller 130 may determine the usage scenario.

In some embodiments, the controller 130 is implemented with a communication IC (Integrated Circuit). The controller 130 can receive antenna information from the coupler 120. The antenna information may be relative to any operational characteristics of the antenna group 110.

The sensor 140 is coupled to the controller 130. The sensor 140 is for sensing and sending the sensor information to the controller 130. The sensor 140 is for example but not limited by, gyroscope, proximity sensor or light sensor which is commonly used in the mobile communication system. Based on the sensor information from the sensor 140, the controller 130 may determine the receiving antenna scenario.

In some embodiments, the first tuner 150 may be connected to the feed port of the antenna group 110; and the first tuner 150 could be used to match the impedance of the antenna. In some embodiments, the first tuner 150 may be called an impedance tuner or an antenna matching circuit. The first tuner 150 is coupled to the antenna group 110 and the coupler 120. The first tuner 150 is coupled between the antenna group 110 and the coupler 120. The first tuner 150 is controlled by the controller 130 to optimize the impedance matching of the antenna. The first tuner 150 is controlled by the controller 130.

In some embodiments, the second tuner 160 could be used for changing an electrical length of the antenna group 110. The second tuner 160 is coupled to the antenna group 110 and the coupler 120. The second tuner 160 is coupled between the antenna group 110 and the coupler 120. The second tuner 160 is controlled by the controller 130. In some embodiments, the second tuner 160 may be called an aperture tuner. The second tuner 160 could be used for aperture tunning. Aperture tuning is a process through which the resonant frequency of the antenna group 110 can be modified and/or tuned to cater to a specific application and/or a specific frequency. By tuning the resonant frequency of the antenna group 110 for a specific application, it can operate very efficiently at that specific frequency. In aperture tuning, the electrical length of the antenna group 110 is altered to adjust the resonant frequency of the antenna group 110. In some embodiments, the second tuner 160 may improve the total radiated power (TRP) and total isotropic sensitivity (TIS) by increasing the effective size of an antenna or by altering antenna radiation pattern. In some embodiments, the first tuner 150 is used for impedance matching, and the second tuner 160 may be used for other tuning purposes besides those of the first tuner 150.

The storage element 170 is coupled to the controller 130. The storage element 170 includes a plurality of hardware circuit to store a usage scenario determination database. Details of creation of the usage scenario determination database are described later.

Figures 2A, 2B, 2C:
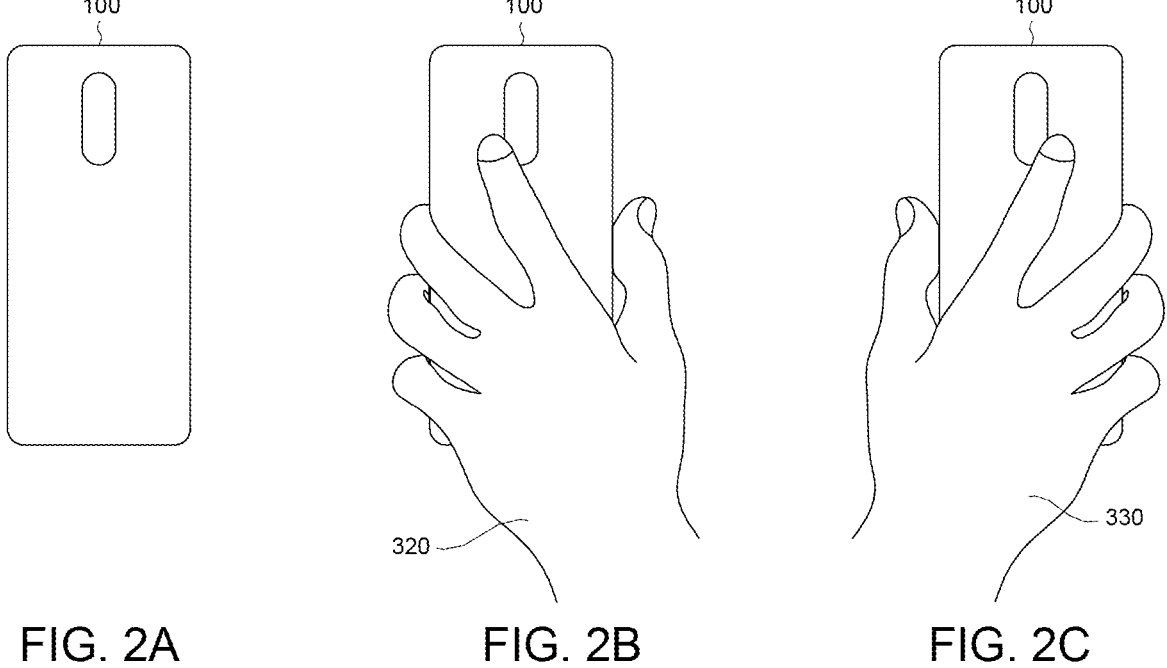
FIG. 2A to FIG. 2E show several modes of the mobile communication system according to an embodiment of the invention.
Figure 2D:
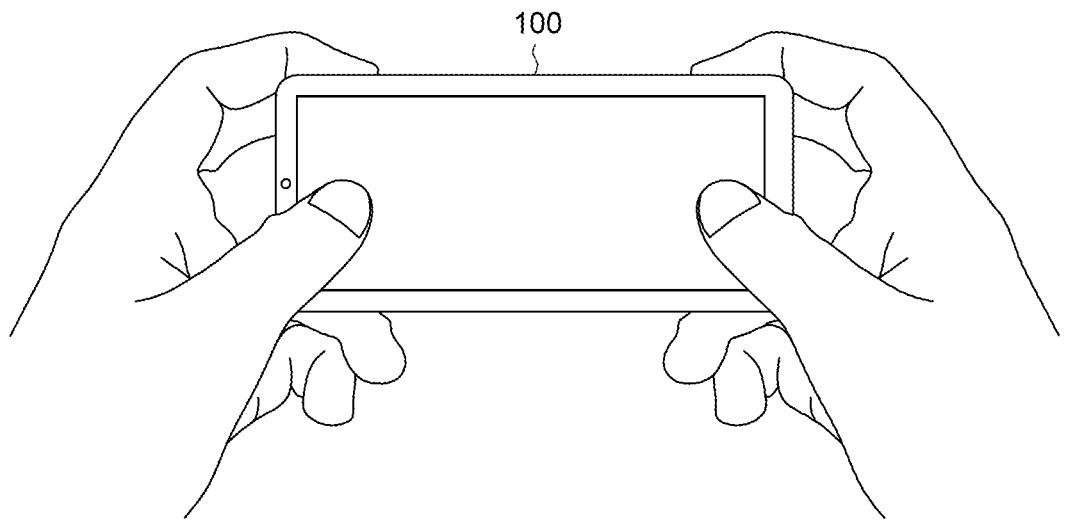
Figure 2E:
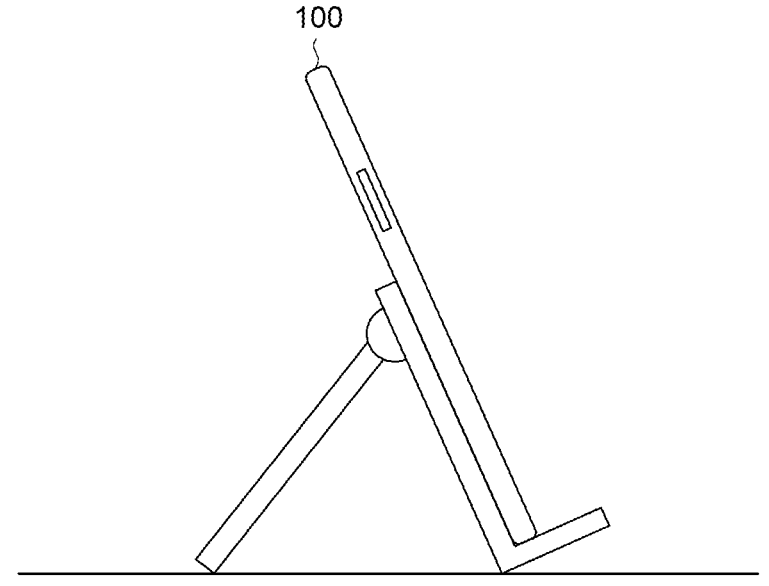

FIG. 2A, FIG. 2B, FIG. 2C, FIG. 2D and FIG. 2E show different usage scenarios of the mobile communication system 100. These usage scenarios are only examples, and the mobile communication system 100 may also have other application scenarios. FIG. 2A is a diagram of the mobile communication system 100 in free space (FS) mode according to an embodiment of the invention. FIG. 2B is a diagram of the mobile communication system 100 held by a left hand (HL) of a user according to an embodiment of the invention. FIG. 2C is a diagram of the mobile communication system 100 held by a right hand (HR) of the user according to an embodiment of the invention. FIG. 2D is a diagram of the mobile communication system 100 held by two hands of the user (i.e. the gaming hand mode) according to an embodiment of the invention. FIG. 2E is a diagram of the mobile communication system 100 in the mobile phone holder (i.e. the navigation mode) according to an embodiment of the invention. That is, in one embodiment of the application, the usage scenarios of the mobile communication system 100 includes the free space mode, the single hand mode, the gaming hand mode and the navigation mode. Of course, this is an example and the application is not limited by this. In some embodiments, the first tuner 150 is a usage scenario-independent tuner, and the second tuner 160 is a usage scenario-dependent tuner. More specifically, the first tuner 150 is used for impedance matching and does not change the electrical length of the antenna group 110 with changes in usage scenarios (or the first tuner 150 keeps the electrical length of an antenna group unchanged as the usage scenario changes). The second tuner 160 changes the electrical length of the antenna group 110 as the usage scenario changes. In some embodiments, there are at least two usage scenarios. For example, when the usage scenario of the mobile communication system 100 changes from the usage scenario shown in FIG. 2A to the usage scenario shown in FIG. 2D (or from the usage scenario shown in FIG. 2C to the usage scenario shown in FIG. 2B, etc.), the first tuner 150 will not affect the electrical length of the antenna group 110, and the second tuner 160 will change the electrical length of the antenna group 110. Therefore, the inventors of the present disclosure have discovered and utilized the aforementioned characteristics to separate the usage scenario-dependent tuner from the usage scenario-independent tuner, thus enabling separate calculations for the databases corresponding to the usage scenario determination of the two types of tuners. The resulting two databases are then added together to obtain the final database. Compared to prior arts, the aforementioned solution of the present disclosure can reduce the computational load and the storage space occupied by the final database.

Figure 3:
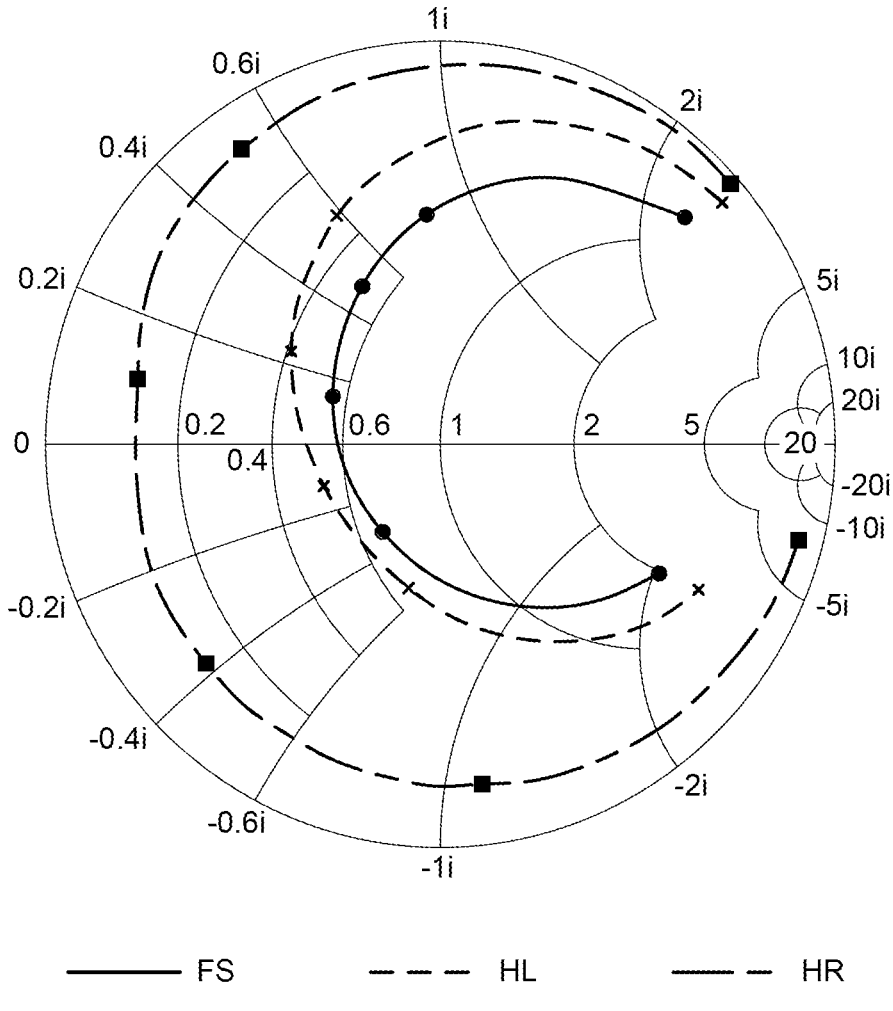
FIG. 3 shows an impedance data view of the mobile communication system according to an embodiment of the invention.

FIG. 3 shows an impedance data view of the mobile communication system 100 according to an embodiment of the invention. As shown in FIG. 3, the usage scenarios is classified as, for example but not limited by, FS (free space) mode, HL (hand-left) mode and HR (hand-right) mode. The symbols "1", "2" and "3" of the impedance data refers to 0.75 ohm under the FS mode, the HL mode and the HR mode, respectively. The symbols "4", "5" and "6" of the impedance data refers to 0.60 ohm under the FS mode, the HL mode and the HR mode, respectively. The symbols "7", "8" and "9" of the impedance data refers to 0.65 ohm under the FS mode, the HL mode and the HR mode, respectively. The symbols "10", "11" and "12" of the impedance data refers to 0.70 ohm under the FS mode, the HL mode and the HR mode, respectively.

One embodiment of the application discloses creation of the usage scenario determination database. In one embodiment of the application, in order to create the usage scenario determination database, when the antenna is selected among the antenna group 110, the testing frequency is selected among a plurality of testing frequencies and the tuning state of the first tuner 150 is determined, the impedance of the first tuner 150 is measured to generate a first part of the usage scenario determination database. That is, in order to create the first part of the usage scenario determination database, the impedance of the first tuner 150 is measured based on the selected antenna, the selected testing frequency and the determined tuning state of the first tuner 150. As the first tuner 150 is the usage scenario-independent tuner, the usage scenarios do not need to be considered when calculating the first part of the usage scenario determination database. In other words, the first tuner 150 does not change the electrical length of an antenna group 110 as the usage scenario changes (or the first tuner 150 keeps the electrical length of an antenna group unchanged as the usage scenario changes), therefore, when calculating the first part of the usage scenario determination database, the factors considered include the number of antennas, the frequency of the antennas and the status of the first tuner 150, but do not include the usage scenarios. In some embodiments, a plurality of testing frequencies (or a plurality of predetermined testing frequencies) can be randomly selected from a predetermined frequency range or selected from a predetermined frequency range according to predetermined rules.

Figure 7:
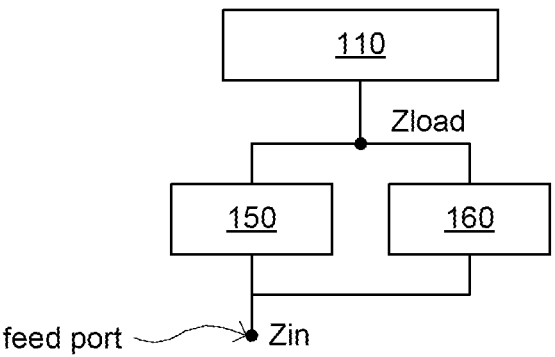
FIG. 7 is a diagram of a first tuner, a second tuner and an antenna group 110 according to one embodiment of the invention.

Still further, in order to create the usage scenario determination database, when the antenna is selected among the antenna group 110, the testing frequency is selected among a plurality of testing frequencies, the tuning state of the second tuner 160 is determined and the usage scenario of the mobile communication system 100 is determined, the antenna impedance is measured to generate a second part of the usage scenario determination database. That is, in order to create the second part of the usage scenario determination database, the antenna impedance (referred to as "Zload", as shown in FIG. 7) is measured based on the selected antenna, the selected testing frequency, the determined tuning state of the second tuner 160 and the determined usage scenario of the mobile communication system 100. In some embodiments, the second tuner 160 can be considered as part of the antenna (such as the selected antenna). In some embodiments, the antenna impedance (Zload) is the combined impedance of the second tuner 160 and the corresponding antenna in the antenna group 110. As the second tuner 160 is the usage scenario-dependent tuner, the usage scenarios need to be considered when calculating the second part of the usage scenario determination database. In other words, the second tuner 160 changes the electrical length of the antenna group 110 as the usage scenario changes, therefore, when calculating the second part of the usage scenario determination database, the factors considered include the number of antennas, the frequency of the antennas and the status of the second tuner 160 and the usage scenarios.

For example but not limited by, the antenna group 110 includes "n" antennas, which are assigned by antenna indexes "1"-"n", "n" being a positive integer and represents a number of antennas in the antenna group 110; there are "m" test frequency "f1"-"fm", "m" being a positive integer and represents a number of the (predetermined) testing frequencies; the first tuner 150 has "a" tuner states, "a" being a positive integer and represents a number of the tuner states of the first tuner 150; the second tuner 160 has "b" tuner states, "b" being a positive integer and represents a number of the tuner states of the second tuner 160; and there are "z" usage scenarios, "z" being a positive integer and represents a number of the at least one usage scenario. As described above, the usage scenario of the mobile communication system 100 includes for example but not limited by, the free space mode, the single hand mode, the gaming hand mode and the navigation mode. These usage scenarios are only examples, and the mobile communication system 100 may also have other application scenarios.

Figure 4:
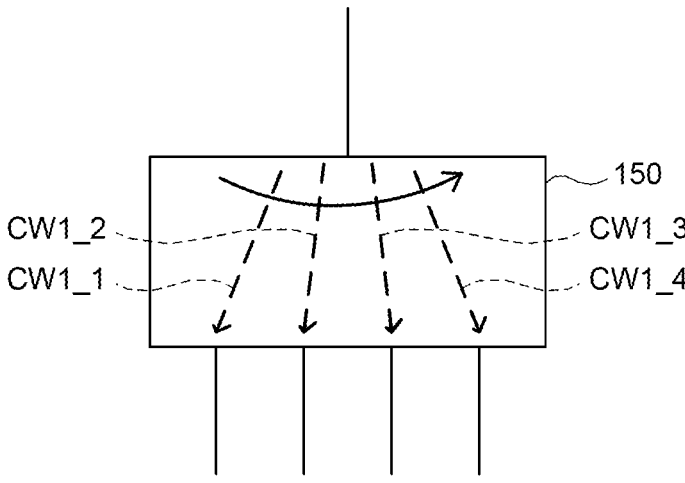
FIG. 4 shows the first tuner according to one embodiment of the application.

FIG. 4 shows the first tuner 150 according to one embodiment of the application. As shown in FIG. 4, the first tuner 150 has four tuning states CW1_1-CW1_4. FIG. 4 is just for an example and the application is not limited by this. Similarly, the second tuner 160 has a plurality of tuning states. In some embodiments, the at least one first tuner 150 and the at least one second tuner 160 can each respectively include multiple tuning states.

In one embodiment of the application, in order to create the usage scenario determination database, when the antenna is selected among the antenna group 110, the testing frequency is selected and the tuning state of the first tuner 150 is determined, the impedance of the first tuner 150 is measured to generate a first part of the usage scenario determination database. For example but not limited by, when a first antenna (having antenna index "1") among the antenna group 110 is selected, the testing frequency f1 is selected, and the tuning state CW1_1 of the first tuner 150 is selected, the impedance of the first tuner 150 is measured to generate a first data of the first part of the usage scenario determination database. Similarly, when the first antenna (having antenna index "1") among the antenna group 110 is selected, the testing frequency f2 is selected, and the tuning state CW1_1 of the first tuner 150 is selected, the impedance of the first tuner 150 is measured to generate a second data of the first part of the usage scenario determination database. Others are so on until every antenna of the antenna group 110 is selected, every testing frequency is selected and every tuning state of the first tuner 150 is selected. By so, the first part of the usage scenario determination database is created.

Thus, the measurement of the S-parameter of the first tuner 150 is established in table 1, which is the first part of the usage scenario determination database. The S-parameter of the first tuner 150 can be converted to the impedance of the first tuner 150. The S-parameter may have the same numerical value as the impedance but with different units. In some embodiments, Table 1 shows the impedance measurements of the first tuner 150.

TABLE 1

| Antenna index | Testing frequency (MHz) | Tuner state of the first tuner 150 | S-parameter of the first tuner 150 |
|---|---|---|---|
| 1 | f1 | CW1_1 | A1 |
| 1 | f2 | CW1_1 | B1 |
| 1 | f3 | CW1_1 | C1 |
| 1 | f4 | CW1_1 | D1 |
| . . . | . . . | . . . | . . . |
| 1 | f1 | CW1_2 | E1 |
| 1 | f2 | CW1_2 | F1 |
| 1 | f3 | CW1_2 | G1 |
| 1 | f4 | CW1_2 | H1 |

TABLE 1-continued

| Antenna index | Testing frequency (MHz) | Tuner state of the first tuner 150 | S-parameter of the first tuner 150 |
|---|---|---|---|
| . . . | . . . | . . . | . . . |

In table 1, A1-H1 refer to the measured S-parameter of the first tuner 150. Then the impedance of the first tuner 150 is obtained by converting S-parameter to impedance. Table 1 shows only a portion of the possible configurations. For the first tuner 150, there may be n*m*a combinations.

In one embodiment of the application, in order to create the usage scenario determination database, when the antenna is selected among the antenna group 110, the testing frequency is selected, the tuning state of the second tuner 160 is determined and the usage scenario of the mobile communication system 100 is determined, the antenna impedance (Zload) is measured to generate the second part of the usage scenario determination database. In some embodiments, for example but not limited by, when the first antenna (having antenna index "1") among the antenna group 110 is selected, the testing frequency f1 is selected, the tuning state CW2_1 of the second tuner 160 is selected, and the usage scenario of the mobile communication system 100 is selected (for example but not limited by, the free space mode), the antenna impedance (Zload) is measured to generate a first data of the second part of the usage scenario determination database. Similarly, when the first antenna (having antenna index "1") among the antenna group 110 is selected, the testing frequency f2 is selected, the tuning state CW2_1 of the second tuner 160 is selected, and the usage scenario of the mobile communication system 100 is determined (for example but not limited by, the free space mode), the antenna impedance (Zload) is measured to generate a second data of the second part of the usage scenario determination database. Others are so on until every antenna of the antenna group 110 is selected, every testing frequency is selected, every tuning state of the second tuner 160 and every usage scenario is selected. By so, the second part of the usage scenario determination database is created.

Thus, the antenna impedance measurement is established in table 2, which is the second part of the usage scenario determination database. In some embodiments, the second tuner 160 can be considered as part of the selected antenna. In some embodiments, the antenna impedance includes the sum of the impedance of the second tuner 160 and the impedance of the corresponding antenna (selected antenna).

TABLE 2

| | | | UE usage scenario 1 | | UE usage scenario 2 | | |
|---|---|---|---|---|---|---|---|
| Ant. index | Testing freq. (MHz) | Tuner state of the second tuner | Measured antenna impedance | Detection criteria | Measured antenna impedance | Detection criteria | . . . . . . |
| 1 | f1 | CW2_1 | A2 | W | A3 | Y | . . . |
| 1 | f2 | CW2_1 | B2 | W | B3 | Y | . . . |
| 1 | f3 | CW2_1 | C2 | W | C3 | Y | . . . |
| 1 | f4 | CW2_1 | D2 | W | D3 | Y | . . . |
| . . . | . . . | . . . | . . . | . . . | . . . | . . . | . . . |
| 1 | f1 | CW2_2 | E2 | W | E3 | Y | . . . |
| 1 | f2 | CW2_2 | F2 | W | F3 | Y | . . . |
| 1 | f3 | CW2_2 | G2 | W | G3 | Y | . . . |
| 1 | f4 | CW2_2 | H2 | W | H3 | Y | . . . |
| . . . | . . . | . . . | . . . | . . . | . . . | . . . | . . . |

In table 2, CW2_1-CW2_2 refer to the tuner states of the second tuner 160. A2-H3 refer to the measured antenna impedance. Table 2 shows only a portion of the possible configurations. For the second tuner 160, there may be n*m*b*z combinations.

In one embodiment of the application, the usage scenario determination database is created by adding the first part and the second part of the usage scenario determination database together.

In table 2, whether the antenna impedance is within the detection criteria is used to decide the usage scenario.

Figure 5:
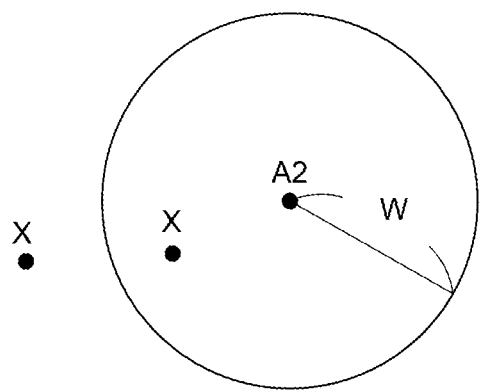
FIG. 5 shows one example of the detection criteria according to one embodiment of the application.

FIG. 5 shows one example of the detection criteria according to one embodiment of the application. As shown in FIG. 5, the detection criteria "W" is a circle having the impedance A2 as the center point while "W" as the radius. When the estimated the input impedance (referred to as "Zin", as shown in FIG. 7) is fallen within the circle, then the usage scenario of the mobile communication system 100 is determined as the first usage scenario. Others are so on. As shown in FIG. 5, for the different user scenarios, antenna has different impedance per frequency. According to the impedance information, UE (user equipment) usage scenario can be confirmed and/or determined.

Still further, in one example of the application, impedance measurement could be implemented by RF components (not shown) for tracking current antenna load. Furthermore, software could optimize antenna performance after UE usage scenario confirmed by tuning the tuner states.

In the prior art, the usage scenario determination database includes "n*m*a*b*z" impedance data. That is, in the prior art, the usage scenario determination database records the impedance data of the antenna under each antenna index, each testing frequency, each tuner state and each usage scenario. Thus, the prior art needs a large memory space to store the usage scenario determination database.

On the contrary, from Table 1 and Table 2, in one embodiment of the application, the usage scenario determination database includes "n*m*(a+b*z)" impedance data, wherein Table 1 includes "n*m*a" impedance data while Table 2 includes "n*m*b*z" impedance data. Thus, the usage scenario determination database includes n*m*a+ n*m*b*z=n*m*(a+b*z) impedance data. The usage scenario determination database is stored into the storage element (for example but not limited by, SSD (solid-state drive)) of the mobile communication system 100. In one embodiment of the application, the usage scenario determination database has a smaller memory size. In some embodiments, for example, n=4 (i.e., the antenna group has 4 antennas), m=80 (i.e., there are 80 testing frequencies (or testing frequency points)), a=1024 (i.e., the first tuner has 1024 tuning states), b=16 (i.e., the second tuner has 16 tuning states), and z=5 (i.e., there are 5 usage scenarios). Following the prior art, the data required would amount to 4*80*1024*16*5=26,214,400 entries, potentially needing 26,214,400 bytes for storage. In contrast, using the method of the present disclosure's embodiment, only 4*80*(1024+ 16*5)=353,280 entries are needed, requiring just 353,280 bytes of storage. Compared with the prior arts, the aforementioned solution disclosed by the present disclosure reduces the storage space by more than 98%, and it significantly decreases both the storage space required and computational load, thus offering clear advantages. In addition, the aforementioned numbers for n, m, a, b, and z are provided only as examples and do not limit the scope of the present disclosure.

FIG. 6 shows a method for creating a usage scenario determination database according to one embodiment of the application. In the step 610, in creating a first part of the usage scenario determination database, repeatedly measuring an impedance of at least one first tuner until all antennas among the antenna group are selected (such as the antenna group 110 includes "n" antennas), a plurality of predetermined testing frequencies are selected (such as there are "m" predetermined testing frequencies) and a plurality of tuning states of at least one first tuner are selected (such as the at least one first tuner 150 has "a" tuner states), wherein the at least one first tuner is an impedance tuner for impedance matching. In the step 620, in creating a second part of the usage scenario determination database, repeatedly measuring an antenna impedance until all antennas among the antenna group are selected (such as the antenna group 110 includes "n" antennas), the plurality of predetermined testing frequencies are selected (such as there are "m" predetermined testing frequencies), a plurality of tuning states of at least one second tuner are selected (such as the at least one second tuner 160 has "b" tuner states) and at least one usage scenarios is selected (such as there are "z" usage scenarios), wherein the at least one second tuner is an aperture tuner for aperture tuning. In the step 630, creating the usage scenario determination database base on the first part and the second part of the usage scenario determination database. In some embodiments, creating the usage scenario determination database by adding the first part and the second part together. Details of the steps 610-630 are as described above and thus are omitted here.

In one embodiment of the application, the usage scenario determination database may be used to detect the usage scenario of the mobile communication system 100. After the detection mode is triggered, the usage scenario determination database is accessed from a storage element (for example but not limited by, SSD) of the mobile communication system 100. The input impedance (referred to as Zin)

is measured. For example, the input impedance (Zin) could be measured at the feed port (as shown in FIG. 7). The input impedance (Zin) is the sum of the impedance of the first tuner 150 and the antenna impedance. Since the antenna impedance is the sum of the impedance of the second tuner 160 and the impedance of the corresponding antenna (or the selected antenna), the input impedance (Zin) is the sum of the impedance of the first tuner 150, the impedance of the second tuner 160 and the impedance of the corresponding antenna (or the selected antenna). At this time, the tuning state of the first tuner 150, the current frequency, and the selected antenna (antenna index) have been determined, therefore the corresponding impedance of the first tuner 150 is also known. Therefore, by subtracting the known impedance of the first tuner 150 from the measured input impedance (Zin), the corresponding antenna impedance (such as Zload shown in FIG. 7) can be obtained. Then, by comparing this corresponding antenna impedance (Zload) with the measured antenna impedance in Table 2, the measured antenna impedance that is equal to or most similar to the corresponding antenna impedance (Zload) can be found in Table 2, thus the usage scenario is confirmed by comparing the input impedance (Zin) (or the antenna impedance (Zload)) with the usage scenario determination database. The mobile communication system 100 is controlled based on the detected usage scenario of the mobile communication system 100.

Still further, in one embodiment of the application, the usage scenario determination database may be used to confirm the usage scenario. The determination result may be used to change different component state to optimize user equipment OTA (Over The Air) performance. Also, the determination result may be used to set corresponding power settings for complying with SAR regulation.

Embodiments of the application disclose a usage scenario determination method (or said a mobile communication method) to get the accurate usage scenario determination result, concluding antenna impedance measurement, OTA performance optimizing, and SAR regulation complied by power setting. Impedance measurement could be an input for user scenario detection to optimize user experience. Multi-antenna use for scenario confirmed could get the more accurate UE usage scenario determination.

In the above embodiments of the application, the antenna impedance is used in determining the usage scenario. By this configuration, the usage scenario of the mobile communication system is accurately determined, which may reduce the error determination rate.

One embodiment of the application discloses a method for usage scenario rule-based data generation which has smaller memorized data size.

In one embodiment of the application, usage scenario detection result could be used for OTA performance enhancement by component state changing or SAR regulation complied by power setting.

In one embodiment of the application, the mobile communication method (or the usage scenario database creation method) has possible ways to implement workflow, and can be implemented by software process.

The method of the invention, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a mobile communication system, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a mobile communication system, the machine becomes an apparatus for practicing the disclosed methods. When implemented on a general-purpose processor, the program code combines with the processor to provide a unique apparatus that operates analogously to application-specific logic circuits.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method for creating a usage scenario determination database, comprising:
in creating a first part of the usage scenario determination database, repeatedly measuring an impedance of at least one first tuner until all antennas among the antenna group are selected, a plurality of predetermined testing frequencies are selected and a plurality of tuning states of the at least one first tuner are selected, wherein the at least one first tuner is an impedance tuner for impedance matching;
in creating a second part of the usage scenario determination database, repeatedly measuring an antenna impedance until all antennas among the antenna group are selected, the plurality of predetermined testing frequencies are selected, a plurality of tuning states of at least one second tuner are selected and at least one usage scenario is selected, wherein the at least one second tuner is an aperture tuner for aperture tuning; and
creating the usage scenario determination database base on the first part and the second part of the usage scenario determination database.

2. The method according to claim 1, wherein
in creating the first part of the usage scenario determination database, when a first antenna among the antenna group is selected, a first testing frequency among the plurality of predetermined testing frequencies is selected and a first tuning state of the plurality of tuning states of the at least one first tuner is selected, the impedance of the at least one first tuner is measured to generate a first data of the first part of the usage scenario determination database.

3. The method according to claim 1, wherein
the first part of the usage scenario determination database includes "n*m*a" impedance data, wherein the "n" is a positive integer and represents a number of antennas in the antenna group, the "m" is a positive integer and represents a number of the predetermined testing frequencies, and the "a" is a positive integer and represents a number of the tuner states of the at least one first tuner.

4. The method according to claim 1, wherein
in creating the second part of the usage scenario determination database, when a first antenna among the antenna group is selected, a first testing frequency among the plurality of predetermined testing frequencies is selected, a first tuning state of the plurality of tuning states of the at least one second tuner is selected and a first usage scenario of the at least one usage scenario is selected, the antenna impedance is measured to generate a first data of the second part of the usage scenario determination database.

5. The method according to claim 1, wherein
the second part of the usage scenario determination database includes "n*m*b*z" impedance data, wherein the "n" is a positive integer and represents a number of antennas in the antenna group, the "m" is a positive integer and represents a number of the predetermined testing frequencies, the "b" is a positive integer and represents a number of the tuner states of the at least one second tuner, and the "z" is a positive integer and represents a number of the at least one usage scenario.

6. The method according to claim 1, wherein
the at least one first tuner is configured to keep an electrical length of an antenna group unchanged as the at least one usage scenario changes.

7. The method according to claim 1, wherein
the at least one second tuner is configured to change the electrical length of the antenna group as the at least one usage scenario changes.

8. The method according to claim 1, wherein the step of creating the usage scenario determination database base on the first part and the second part of the usage scenario determination database comprising:
creating the usage scenario determination database by adding the first part and the second part of the usage scenario determination database together.

9. The method according to claim 1, wherein
the antenna impedance includes a sum of an impedance of the second tuner and an impedance of a corresponding antenna.

10. A mobile communication system, comprising:
an antenna group;
a coupler coupled to the antenna group, the coupler being used in impedance measurement of the antenna group;
a controller coupled to the coupler;
at least one first tuner coupled to the antenna group and the coupler;
at least one second tuner coupled to the antenna group and the coupler; and a storage element coupled to the controller, the storage element including a plurality of hardware circuit to store a usage scenario determination database;

wherein the controller is configured for:

in creating a first part of the usage scenario determination database, repeatedly measuring an impedance of at least one first tuner until all antennas among the antenna group are selected, a plurality of predetermined testing frequencies are selected and a plurality of tuning states of the at least one first tuner are selected, wherein the at least one first tuner is an impedance tuner for impedance matching;

in creating a second part of the usage scenario determination database, repeatedly measuring an antenna impedance until all antennas among the antenna group are selected, the plurality of predetermined testing frequencies are selected, a plurality of tuning states of at least one second tuner are selected and at least one usage scenario is selected, wherein the at least one second tuner is an aperture tuner for aperture tuning; and creating the usage scenario determination database base on the first part and the second part of the usage scenario determination database.

11. The mobile communication system according to claim 10, wherein in creating the first part of the usage scenario determination database, when a first antenna among the antenna group is selected, a first testing frequency among the plurality of predetermined testing frequencies is selected and a first tuning state of the plurality of tuning states of the at least one first tuner is selected, the impedance of the at least one first tuner is measured to generate a first data of the first part of the usage scenario determination database.

12. The mobile communication system according to claim 10, wherein the first part of the usage scenario determination database includes "n*m*a" impedance data, wherein the "n" is a positive integer and represents a number of antennas in the antenna group, the "m" is a positive integer and represents a number of the predetermined testing frequencies, and the "a" is a positive integer and represents a number of the tuner states of the at least one first tuner.

13. The mobile communication system according to claim 10, wherein in creating the second part of the usage scenario determination database, when a first antenna among the antenna group is selected, a first testing frequency among the plurality of predetermined testing frequencies is selected, a first tuning state of the plurality of tuning states of the at least one second tuner is selected and a first usage scenario of the at least one usage scenario is selected, the antenna impedance is measured to generate a first data of the second part of the usage scenario determination database.

14. The mobile communication system according to claim 10, wherein the second part of the usage scenario determination database includes "n*m*b*z" impedance data, wherein the "n" is a positive integer and represents a number of antennas in the antenna group, the "m" is a positive integer and represents a number of the predetermined testing frequencies, the "b" is a positive integer and represents a number of the tuner states of the at least one second tuner, and the "z" is a positive integer and represents a number of the at least one usage scenario.

15. The mobile communication system according to claim 10, wherein the at least one first tuner keeps an electrical length of an antenna group unchanged as the usage scenario changes, and the at least one second tuner changes the electrical length of the antenna group as the usage scenario changes.

16. The mobile communication system according to claim 10, wherein the antenna impedance includes a sum of an impedance of the second tuner and an impedance of a corresponding antenna.

17. A method for creating a usage scenario determination database, comprising:

creating a first part of the usage scenario determination database by repeatedly measuring an impedance of at least one first tuner until all antennas among the antenna group are selected, a plurality of predetermined testing frequencies are selected and a plurality of tuning states of the at least one first tuner are selected, wherein the first part includes "n*m*a" impedance data, wherein the "n" is a positive integer and represents a number of the antennas in the antenna group, the "m" is a positive integer and represents a number of the predetermined testing frequencies, and the "a" is a positive integer and represents a number of the tuner states of the at least one first tuner, wherein the at least one first tuner is a usage scenario-independent tuner;

creating a second part of the usage scenario determination database by repeatedly measuring the antenna impedance until all antennas among the antenna group are selected, the plurality of predetermined testing frequencies are selected, a plurality of tuning states of at least one second tuner are selected and at least one usage scenario is selected, wherein the second part of the usage scenario determination database includes "n*m*b*z" impedance data, wherein the "b" is a positive integer and represents a number of the tuner states of the at least one second tuner, and the "z" is a positive integer and represents a number of the at least one usage scenario, wherein the at least one second tuner is a usage scenario-dependent tuner; and creating the usage scenario determination database base on the first part and the second part of the usage scenario determination database.

18. The method according to claim 17, wherein the at least one first tuner is an impedance tuner used for impedance matching, and the at least one second tuner is an aperture tuner used for aperture tunning.

19. The method according to claim 17, wherein the at least one first tuner is configured to keep an electrical length of an antenna group unchanged as the at least one usage scenario changes, and the at least one second tuner is configured to change the electrical length of the antenna group as the at least one usage scenario changes.

20. The method according to claim 17, wherein the usage scenario determination database includes "n*m*a+n*m*b*z" impedance data.

* * * * *